United States Patent [19]

Sydor et al.

[11] 4,339,722
[45] Jul. 13, 1982

[54] DIGITAL FREQUENCY MULTIPLIER

[75] Inventors: Philip R. Sydor, Tadley; Graham J. Brooker, Hungerford, both of England

[73] Assignee: Micro Consultants Limited, Berkshire, England

[21] Appl. No.: 151,546

[22] Filed: May 20, 1980

[30] Foreign Application Priority Data

May 23, 1979 [GB] United Kingdom ............... 7918058

[51] Int. Cl.³ ............................................. H03K 21/30
[52] U.S. Cl. ............................... 328/38; 235/92 DM; 235/92 CA
[58] Field of Search ..................... 328/38; 307/225 R; 235/92 DM, 92 CA

[56] References Cited

U.S. PATENT DOCUMENTS 3,935,538 1/1976 Kizler ..................................... 328/38
4,053,839 10/1977 Knoedl .................................. 328/38
4,086,471 4/1978 Takahashi .......................... 328/38 X Primary Examiner—John S. Heyman
Attorney, Agent, or Firm—Dowell & Dowell

[57] ABSTRACT

A digital frequency multiplier which includes a first counter for counting the number of clock pulses received from a generator having first been divided by N in a divider. The counter establishes the number of these pulses which occur during a cycle of the incoming frequency and this number is compared in a comparator with the count from a further clock counter. Typically when coincidence occurs a change of state of the comparator results and as this coincidence will occur N times during a cycle of the incoming frequency, the output repetition frequency from the comparator will be N times the incoming frequency. Although division can be provided prior to the first counter this can alternatively be provided after this counter by using an arithmetic divider.

22 Claims, 3 Drawing Figures

DIGITAL FREQUENCY MULTIPLIER

BACKGROUND TO THE INVENTION

The invention relates to a frequency multiplier system and more particularly to a digital frequency multiplier system suitable for handling a varying input frequency signal typically at relatively low frequencies.

In known frequency multiplication systems use is made of phase locked loops or voltage to frequency and frequency to voltage conversion. Phase locked loop (PLL) techniques commonly used for frequency multiplication have certain drawbacks. The principle drawback at low frequencies is the loop response time due to the low pass filter used in the feedback loop of the PLL. This effectively means that at very low input frequencies the frequency produced by the PLL may drift considerably. Also phase locked loops cannot readily cope with high dynamic ranges coupled with high multiplication factors. For these to be correctly implemented high response times are required which are unacceptable. The further disadvantage is that the phase locked loop is essentially an analogue system and this gives a poor performance when the temperature of the system is subject to change.

The other common method of frequency multiplying is to convert the input frequency to an analogue voltage, process this voltage, probably with an op-amp, and then convert this voltage to a higher frequency using a V/F converter. Again problems occur at low frequencies—the Frequency to Voltage (F/V) converter cannot produce a steady voltage output. A large amount of ripple is produced which may be easily eliminated using some form of DC filter technique. In so doing the response time of the system becomes too high and again this is unacceptable. This system is also an analogue system and thus suffers in the same way as PLL's.

SUMMARY OF THE INVENTION

According to the invention there is provided a digital frequency multiplier comprising: a first path and a second path, a first source of clock pulses and a second source of clock pulses for supplying said first and second paths respectively, first counter means in said first path, said first counter means having a first input for receiving an incoming frequency and for determining the number of pulses occuring from said first source during the period between sequential cycles of said incoming frequency, divider means in said first path for dividing the first clock pulses relative to the incoming rate, second counter means in said second path for counting the number of clock pulses from said second source, and comparator means connected to receive the outputs of the first and second paths respectively to produce an output signal having a repetition frequency which is a multiple of the incoming frequency.

The digital frequency multiplier overcomes the difficulties incurred in the conventional methods of frequency multiplication, and two principle advantages are:

1. Fast response time: 1/input frequency
2. Negligible degradation in performance with changing temperature.

The digital technique also offers predictability in that the performance of the system may be repeated. Also all the parameters relevant to the system's operation may be readily calculated, including output jitter (which is a function of the clock frequency), at all times. This means that the systems performance does not drift with time—as occurs in the analogue cases.

The system to be described typically can accept any input frequencies from approximately 1 Hz to 10 KHz and multiply these by an integer from 2 to N to produce an output frequency in the range 2 Hz to 1 MHz (practical value).

BRIEF DESCRIPTION OF DRAWINGS

The invention will now be described by way of example with reference to the accompanying drawings, in which.

DESCRIPTION OF PREFERRED EMBODIMENTS

Figure 1:
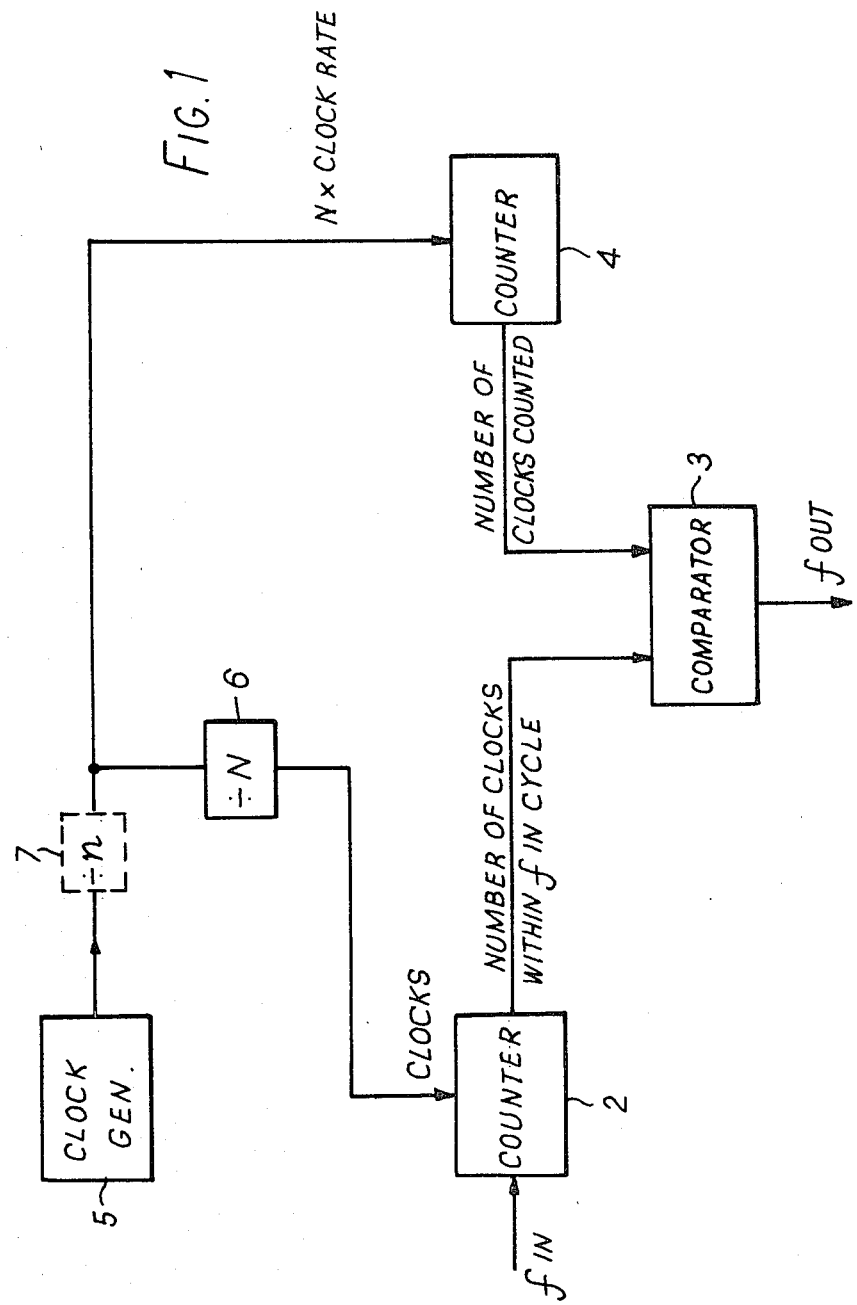
FIG. 1 shows an arrangement for providing the digital frequency multiplier of the invention.

The digital frequency multiplier arrangement of FIG. 1 includes a counter 2 which received an incoming frequency $f_{in}$ which is to be multiplied. The counter is effectively gated by the incoming frequency to allow the number of clock pulses produced by clock generator 5 and passed via divider 6 for receipt by counter 2 to be determined during a cycle of the incoming frequency, the clocks being received at a frequency typically substantially higher than $f_{in}$.

The clocks from generator 5 are also received by counter 4 which rate at N times that received by counter 2. The output of counter 4 will be the total number of clocks received since the counter 2 was reset. The outputs of counters 2 and 4 are made available to a comparator 3 which effectively produces a change in level when there is a certain relationship (e.g. coincidence) between the number held by counter 2 and that reached by counter 4. Following coincidence between these counts the system elements can be reset as necessary and the operation repeated. The frequency $f_{out}$ will be provided at a rate which will be N times $f_{in}$. Thus by varying the selection of the ratio in divider 6, the coefficient applied to the input frequency can be varied as desired.

If clock generator 5 provides a fixed frequency for example it would be possible to include an arrangement for varying the selected basic frequency by means of a divider for example as shown by divider block 7 if desired.

Figure 2:
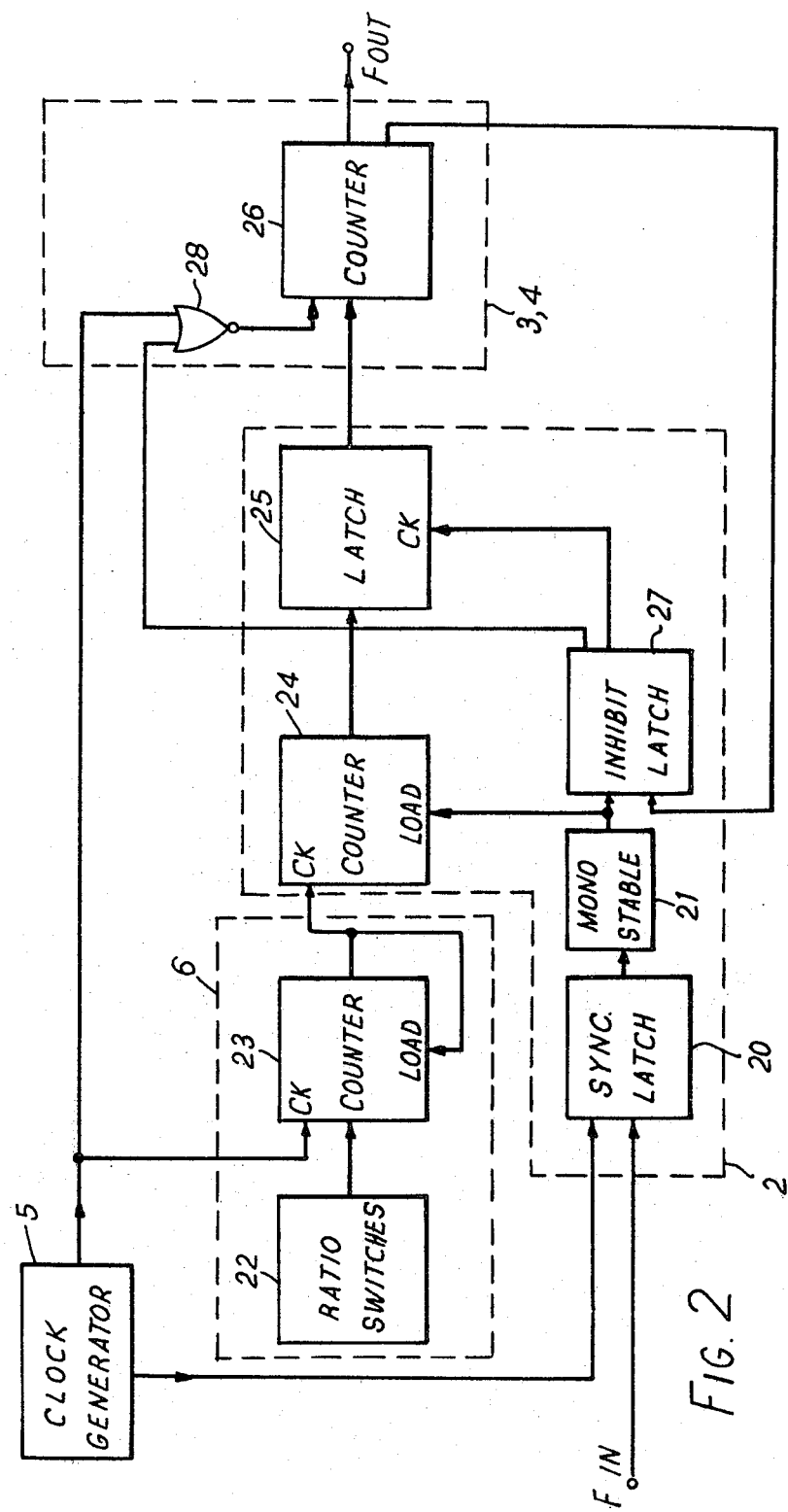
FIG. 2 shows one arrangement for realising the system of FIG. 1.

The arrangement of FIG. 2 shows one example of how the system of FIG. 1 can be realised.

The incoming frequency $F_{in}$ is input to the clock counter system 2 shown in broken lines, which includes synchronising latch 20 which is controlled by clocks from clock generator 5. Generator 5 produces fast clock pulses up to 30 MHz for standard TTL logic although this could be increased if ECL logic is used. (The generator 5 also supplies clock pulses to dividing counter 23 and counter 26, as described below).

In this example divider 6 includes a divide by N counter 23 (e.g. 74S169 4 bit synchronous counters). Selector block 22 sets the division integer for these counters. The integer value may be set using switches or wire links, 9 switch outputs providing the possibility of up to 512:1 ratio for counter 23. There are 3×74S169 counters used to provide a division ratio of 512. Hence the clock may be divided down by any integer between 2 and 512 in this example (2 and N in the general case with suitable modification of the counter capabilities). The output of dividing counter 23 is used to clock the period counter 24 within block 2. The counter 24 counts down from all binary 1's till reset by the synchronised input pulse derived from $F_{in}$. Synchronising block 20 basically comprises a latch which is provided to synchronise the incoming pulses at $F_{in}$ (typically even mark: space ratio squarewave). The latched output is typically fed via a very fast monostable 21 prior to receipt as the load signal by counter 24. The fast monostable can expediently be constructed by connecting the latched pulse directly to one input of a NAND gate and to the other input of the NAND gate via triple cascaded inverters to provide a pulse of the order of 50 ns.

The output of this monostable 21 is used to load the counter 24 (e.g. 4×74LS169). The load pulse to these counters only occurs on positive transitions of the incoming frequency hence, in effect, it is measuring the period of this frequency. The output of these counters (i.e. 16 bit number) is then held in a latch 25 (the period latches).

The period latches 25 are updated whenever the period counters are about to be loaded, hence these latches will store the period of the incoming frequency.

The output of the period latches (i.e. 16 bit number) is used to load the counter 26 (e.g. 4×74S169) within block 3, 4. These counters are set to count up from the loaded value. When they reach zero a ripple clock occurs which is used as the output frequency and the value from the period (latches) is again loaded.

Expediently, latching block 27 is provided which is used to inhibit any conflicts between the self loading counters 26 and the clock which updates the latches 25. Thus the latch update is inhibited when an output pulse from counter 26 occurs. Similarly NOR gate 28 is provided to inhibit the fast clock pulses to counter 26 whenever latch block 25 is being loaded to avoid any conflicts resulting in output frequency errors.

The output period is a multiple of the clock period therefore the non linearity caused by the jitter may be precisely determined. Hence the smaller the period the less inaccuracy in linearity. Thus to ensure accuracy in the output frequency, the frequency of the fast clock must be kept high.

It can be seen that the digital system requires that one clock rate is N times the other where N is an integer.

In the example shown this is achieved by dividing the higher clock rate by means of dividing counter 23 in dependence on the ratio selected by selector switches 22.

Although counters 24 and 26 have been described as counting down and up respectively, these operations could be reversed so that the counter 24 counts up from zero and counter 26 is arranged to count down from all 1's.

Figure 3:
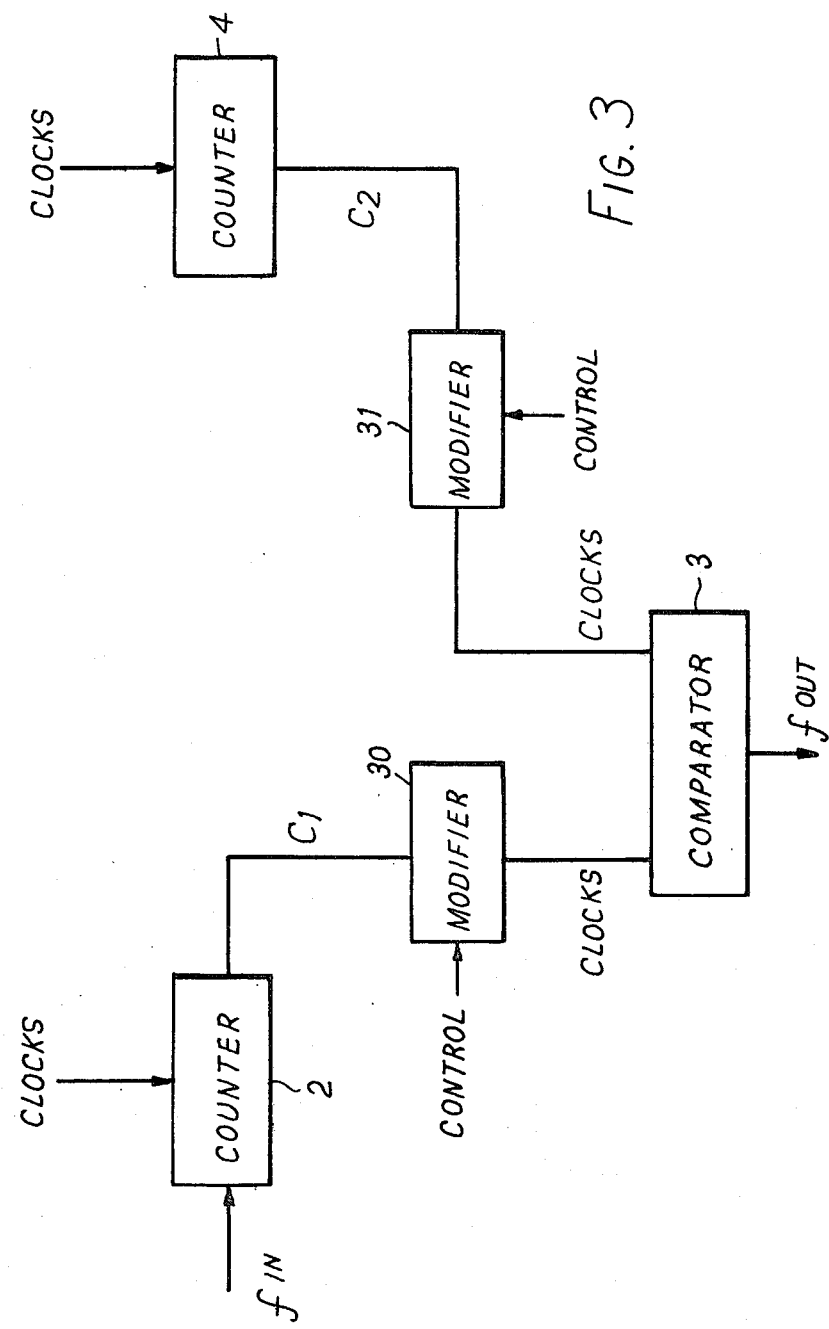
FIG. 3 shows an alternative system to that of FIG. 1.

An alternative system to that of FIGS. 1 and 2 is shown in FIG. 3. In this situation the clocks for counter 2 within $F_{in}$ period are determined to provide count $C_1$ and the clocks for counter 4 are established to provide count $C_2$. Counts $C_1$ and $C_2$ can pass via respective modifiers 30 and 31 to coincidence comparator 3. The modifiers can manipulate the counter output by means of a control input (e.g. a clock pulse or binary number) so as to modify the relationship between counts $C_1$ and $C_2$ such that $f_{out}$ is changed. Typically modifiers 30, 31 could comprise an arithmetic divider for providing division in dependence on a selected binary number entered as the control. In such a situation it could be possible for counters 2 and 4 to receive the clock pulses directly from generator 5 of FIG. 1 and to rely on the modifiers to provide the desired ratio for N. In dependence on the values selected for modifiers 30 and 31 it would be possible to provide a ratio between $f_{in}$ and $f_{out}$ which is not an integer.

A microprocessor based configuration could be used to generate this control and may also be expanded to replace some of the hardware functions.

We claim:

1. A digital frequency multiplier comprising:
a first path and a second path,
a first source of clock pulses and a second source of clock pulses for supplying said first and second paths respectively,
divider means in said first path for dividing the first clock pulses relative to the incoming rate,
first counter means in said first path, said first counter means having a first input for receiving an incoming frequency and for determining the number of pulses occuring from said first source during the period between sequential cycles of said incoming frequency,
holding means for periodically holding the count determined by said first counter means updated at a rate dependant on the incoming frequency,
second counter means in said second path for counting the number of clock pulses from said second source,
comparator means connected to receive the outputs of the first and second paths respectively to produce an output signal having a repetition frequency which is a multiple of the incoming frequency, and
inhibit means for momentarily inhibiting a change in the count provided by said second counter means whenever the holding means is being updated.

2. A multiplier according to claim 1, including second inhibit means for momentarily inhibiting updating of the count from said first counter means to said holding means whenever a change in the comparator output occurs.

3. A multiplier according to claim 2, wherein said holding means comprises a first latch for holding the first counter output and said second inhibit means comprises a second latch for inhibiting loading of said first latch when a change in output from said comparator means is detected.

4. A multiplier according to claim 1, including common clock generator means for providing said first and second sources of clock pulses.

5. A multiplier according to claim 1, wherein said divider means is adapted to provide a reduction in the rate of clock pulses from said first source prior to receipt by said first counter means.

6. A multiplier according to claim 1, wherein modifier means are provided in said second path to allow a multiplication rate selected to be other than an integer.

7. A multiplier according to claim 1, wherein said comparator means is adapted to provide a change in the output signal whenever coincidence between the counts from said first and second paths is detected.

8. A multiplier according to claim 1, wherein said comparator means is integral with said second counter means.

9. A multiplier according to claim 8, wherein the comparator means is adapted to detect the count made available from said holding means relative to the count made available to an input of said second counter means.

10. A multiplier according to claim 1, wherein said divider means includes a clock counter for receiving the pulses from said first source and ratio switches for selecting the desired clock rate reduction produced at the output of said clock counter.

11. A multiplier according to claim 1, wherein said first counter means includes a period counter for counting the number of clock pulses received at its input during a cycle of the incoming frequency and said holding means are provided for holding the counter output for use during a subsequent operation cycle.

12. A multiplier according to claim 1, wherein synchronising means are provided prior to the first counter means to synchronise the incoming frequency to the clocks from said first source.

13. A multiplier according to claim 12, wherein said synchronising means comprises a synchronising latch and includes a monostable circuit connected to said synchronising latch to provide a narrow width synchronising pulse for controlling the first counter means.

14. A multiplier according to claim 1, wherein said second counter means comprises a down counter adapted to count down from a number dependent on that counted by said first counter means and said comparator means is provided within said second counter means to produce an output pulse when a zero count is detected.

15. A multiplier according to claim 1, wherein said second counter means comprises an up counter adapted to count up from zero to a predetermined number dependent on that counted from said first counter means and said comparator means is provided within said second counter means to produce an output pulse when the predetermined number is reached.

16. A multiplier according to claim 1, wherein said divider means is adapted to provide a reduction in the output from said first counter means prior to receipt by said comparator means.

17. A multiplier according to claim 1, wherein the divider means comprises an arithmetic divider for reducing the arithmetic output provided by the holding means prior to receipt by the comparator means.

18. A multiplier according to claim 17, wherein a second arithmetic divider is provided in said second path for reducing the arithmetic output provided by said second counter means prior to receipt by said comparator means.

19. A digital frequency multiplier comprising:
a first path and a second path,
a first source of clock pulses and a second source of clock pulses for supplying said first and second paths respectively,
first counter means in said first path, said first counter means having a first input for receiving an incoming frequency and for determining the number of pulses occuring from said first source during the period between sequential cycles of said incoming frequency,
divider means in said first path for dividing the first clock pulses relative to the incoming rate,
second counter means in said second path for counting the number of clock pulses from said second source,
comparator means connected to receive the outputs of the first and second paths respectively to produce an output signal having a repetition frequency which is a multiple of the incoming frequency, and
holding means comprising a first latch is provided for holding the first counter output and a second latch is provided for inhibiting the loading of said first latch when a change in output from said comparator means is detected.

20. A digital frequency multiplier comprising:
a first path and a second path,
a first source of clock pulses and a second source of clock pulses for applying said first and second paths respectively,
first counter means in said first path, said first counter means having a first input for receiving an incoming frequency and for determining the number of pulses occuring from said first source during the period between sequential cycles of said incoming frequency,
divider means in said first path for dividing the first clock pulses relative to the incoming rate,
second counter means in said second path for counting the number of clock pulses from said second source,
comparator means connected to receive the outputs of the first and second paths respectively to produce an output signal having a repetition frequency which is a multiple of the incoming frequency, and
synchronising means are provided prior to said first counter means to synchronise the incoming frequency to the first source clocks, said synchronising means comprising a synchronising latch and a monotable circuit connected thereto to provide a narrow width pulse for controlling the first counter means.

21. A method of digitally multiplying an incoming frequency comprising:
providing a first source of clock pulses and a second source of clock pulses for supplying first and second paths respectively,
dividing the first clock pulses in said first path relative to the incoming rate,
determining the number of pulses in said first path occuring from said first source during the period between sequential cycles of the incoming frequency,
periodically holding the determined number of pulses in the first path between sequential cycles of the incoming frequency,
counting the number of clock pulses in said second path from said second source,
comparing the outputs of the first and second paths respectively to detect whenever a predetermined relationship therebetween occurs to produce an output signal having a repetition frequency which is a multiple of the incoming frequency, and
momentarily inhibiting a change in the number of clock pulses counted in the second path whenever the held pulses are updated.

22. A method according to claim 21, including the step of inhibiting the held pulse count whenever a change in the comparison step occurs.

* * * * *